United States Patent
Ozawa et al.

(10) Patent No.: US 12,263,452 B2
(45) Date of Patent: Apr. 1, 2025

(54) GAS SOLUTION SUPPLY DEVICE

(71) Applicant: EBARA CORPORATION, Tokyo (JP)

(72) Inventors: Suguru Ozawa, Tokyo (JP); Yuji Araki, Tokyo (JP); Toshifumi Watanabe, Tokyo (JP); Yoichi Nakagawa, Tokyo (JP); Risa Kimura, Tokyo (JP); Tao Xu, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 788 days.

(21) Appl. No.: 17/488,814

(22) Filed: Sep. 29, 2021

(65) Prior Publication Data

US 2022/0105478 A1  Apr. 7, 2022

(30) Foreign Application Priority Data

Oct. 1, 2020 (JP) .................................. 2020-167237
Jun. 1, 2021 (JP) .................................. 2021-092452

(51) Int. Cl.
*B01F 23/00* (2022.01)
*B01D 19/00* (2006.01)
(Continued)

(52) U.S. Cl.
CPC ...... *B01F 23/2323* (2022.01); *B01D 19/0063* (2013.01); *B01D 19/0068* (2013.01); *B01F 23/703* (2022.01); *B01F 23/803* (2022.01); *B01F 25/31* (2022.01); *B01F 25/51* (2022.01); *B01F 35/2211* (2022.01); *B01F 35/7176* (2022.01); *B01F 35/718051* (2022.01);
(Continued)

(58) Field of Classification Search
CPC .. B01F 23/2323; B01F 23/803; B01F 23/703; B01F 35/718051; B01F 35/7176; B01F 25/51; B01F 25/31; B01F 35/2211; B01F 2101/58; B01F 23/237613; B01D 19/0063; B01D 19/0068; H01L 21/02041
See application file for complete search history.

(56) References Cited

U.S. PATENT DOCUMENTS

2016/0361693 A1    12/2016   Hayashi et al.
2017/0282132 A1*   10/2017   Ozawa ................ B01F 35/2132
2018/0333686 A1*   11/2018   Nakagawa ......... B01D 19/0036

FOREIGN PATENT DOCUMENTS

CN            2541450 Y     3/2003
JP        2013-010068 A     1/2013
(Continued)

*Primary Examiner* — Anshu Bhatia
(74) *Attorney, Agent, or Firm* — Chrisman Gallo Tochtrop LLC (57) ABSTRACT

A gas solution supply device 1 includes: a first gas-liquid separator 8 in which gas solution is stored; a second gas-liquid separator 16 provided at a stage subsequent to the first gas-liquid separator 8 and in which gas solution to be supplied to a use point is stored; an intermediate line 17 provided between the first gas-liquid separator 8 and the second gas-liquid separator 16; a pressure booster pump 18 provided on the intermediate line 17 and increases a pressure of gas solution being supplied from the first gas-liquid separator 8 to the second gas-liquid separator 16; a gas supply line 2 that supplies gas as a material of the gas solution; and a gas dissolving unit 20 provided on the intermediate line 17 and dissolves the gas supplied from the gas supply line 2 in the gas solution supplied from the first gas-liquid separator 8.

5 Claims, 9 Drawing Sheets

(51) Int. Cl.
    *B01F 23/232*     (2022.01)
    *B01F 23/70*     (2022.01)
    *B01F 23/80*     (2022.01)
    *B01F 25/31*     (2022.01)
    *B01F 25/51*     (2022.01)
    *B01F 35/221*     (2022.01)
    *B01F 35/71*     (2022.01)
    *B01F 23/237*     (2022.01)
    *B01F 101/58*     (2022.01)
    *H01L 21/02*     (2006.01)

(52) U.S. Cl.
    CPC ... *B01F 23/237613* (2022.01); *B01F 2101/58* (2022.01); *H01L 21/02041* (2013.01)

(56) References Cited

FOREIGN PATENT DOCUMENTS

| | | |
|---|---|---|
| JP | 6055049 B1 | 12/2016 |
| JP | 2019-155221 A | 9/2019 |
| TW | 201332641 A | 8/2013 |
| WO | 2004-063100 A2 | 7/2004 |
| WO | 2013-001926 A1 | 1/2013 |
| WO | 2017/051987 A1 | 3/2017 |
| WO | 2019/0163105 A1 | 8/2019 |

\* cited by examiner

GAS SOLUTION SUPPLY DEVICE

BACKGROUND OF THE INVENTION

Field of the Invention

The present invention relates to a gas solution supply device for supplying gas solution, and in particular to a technique for achieving a high concentration of gas solution.

Description of the Related Art

Ozone water has been used for cleaning electronic components such as semiconductor devices and liquid crystal. Ozone water is produced by dissolving ozone gas in ultrapure water and then supplied to a use point (such as a semiconductor device factory and an electronic component factory).

In a conventional ozone water producing device, ozone water produced by dissolving ozone gas in ultrapure water is stored in a gas-liquid separator and the ozone water is delivered from the gas-liquid separator to the use point by a pump located at a stage subsequent to the gas-liquid separator (downstream thereof), for example (see Japanese Patent Laid-Open No. 2019-155221, for instance).

However, since a conventional device has only one gas-liquid separator and a pump (a pump for delivering ozone water to the use point) is provided subsequent to the gas-liquid separator, a pressure in the gas-liquid separator is difficult to increase, making it difficult to achieve a high concentration of ozone water. Where the pump is an air-driven pump, it is also difficult to suppress fluctuations in delivery pressure of ozone water due to influence of pulsation of the pump.

An object of the present invention, which has been made in view of these challenges, is to provide a gas solution supply device that can achieve a high concentration of gas solution and can suppress fluctuations in the delivery pressure of gas solution.

SUMMARY OF THE INVENTION

A gas solution supply device according to the present invention includes: a first gas-liquid separator in which gas solution is stored; a second gas-liquid separator which is provided at a stage subsequent to the first gas-liquid separator and in which gas solution to be supplied to a use point is stored; an intermediate line provided between the first gas-liquid separator and the second gas-liquid separator; a pressure booster pump that is provided on the intermediate line and increases a pressure of gas solution being supplied from the first gas-liquid separator to the second gas-liquid separator; a gas supply line that supplies gas as a material of the gas solution; and a gas dissolving unit that is provided on the intermediate line and dissolves the gas supplied from the gas supply line in the gas solution supplied from the first gas-liquid separator.

In this arrangement, the pressure booster pump is provided at a stage preceding the second gas-liquid separator, so that the pressure in the second gas-liquid separator can be increased and a high concentration of gas solution is possible. In addition, providing the second gas-liquid separator at a stage subsequent to the pressure booster pump results in damper effect, making it possible to suppress fluctuations in delivery pressure of gas solution being supplied from the second gas-liquid separator to the use point.

In the gas solution supply device of the present invention, the first gas-liquid separator may include a circulating supply line for circulating and supplying unused gas solution at the use point.

With this arrangement, unused gas solution at the use point can be recycled and usage of gas as a material of gas solution can be reduced. Since in this case the first gas-liquid separator, to which unused gas solution at the use point is supplied, is provided at a stage preceding the pressure booster pump, there is no need for a pump to increase the pressure of the unused gas solution.

In the gas solution supply device of the present invention, the first gas-liquid separator may include a liquid supply line through which liquid as a material of the gas solution is supplied, and the liquid supply line may include a second gas dissolving unit that dissolves undissolved excess gas discharged from the second gas-liquid separator in the liquid as a material of the gas solution.

With this arrangement, undissolved excess gas discharged from the second gas-liquid separator can be recycled and usage of gas as a material of gas solution can be reduced.

The gas solution supply device of the present invention may include: a first valve provided on a liquid supply line that supplies liquid as a material of the gas solution; a second valve provided on a gas solution supply line that supplies the gas solution to the use point; a third valve provided on an exhaust line from the first gas-liquid separator to an exhaust port; a fourth valve provided on a drain line branching from the exhaust line; and a control unit that performs open and close control of the first valve, the second valve, the third valve, and the fourth valve. The control unit may be configured to: when the gas solution is to be supplied to the use point, perform control to open the first valve, the second valve and the third valve and close the fourth valve, and when the first gas-liquid separator and the second gas-liquid separator are to be cleaned, perform control to close the second valve and the third valve and open the first valve and the fourth valve.

With this arrangement, gas solution can be supplied to the use point by opening the first, the second and the third valves and closing the fourth valve, while the first gas-liquid separator and the second gas-liquid separator can be cleaned by closing the second and the third valves and opening the first and the fourth valves.

A method according to the present invention is a method for execution in a gas solution supply device, the gas solution supply device including: a first gas-liquid separator in which gas solution is stored; a second gas-liquid separator which is provided at a stage subsequent to the first gas-liquid separator and in which gas solution to be supplied to a use point is stored; an intermediate line provided between the first gas-liquid separator and the second gas-liquid separator; and a pressure booster pump that is provided on the intermediate line and increases a pressure of gas solution being supplied from the first gas-liquid separator to the second gas-liquid separator. The method includes the steps of supplying gas as a material of the gas solution to the intermediate line, and dissolving the supplied gas in the gas solution supplied from the first gas-liquid separator.

This method can also increase the pressure in the second gas-liquid separator and enable a high concentration of gas solution because the pressure booster pump is provided at a stage preceding the second gas-liquid separator as with the device above. Further, providing the second gas-liquid separator at a stage subsequent to the pressure booster pump results in damper effect, making it possible to suppress fluctuations in delivery pressure of gas solution being supplied from the second gas-liquid separator to the use point.

In the method of the present invention, the gas solution supply device may include: a first valve provided on a liquid supply line that supplies liquid as a material of the gas solution; a second valve provided on a gas solution supply line that supplies the gas solution to the use point; a third valve provided on an exhaust line from the first gas-liquid separator to an exhaust port; and a fourth valve provided on a drain line branching from the exhaust line. The method may include: when the gas solution is to be supplied to the use point, opening the first valve, the second valve and the third valve and closing the fourth valve, and when the first gas-liquid separator and the second gas-liquid separator are to be cleaned, closing the second valve and the third valve and opening the first valve and the fourth valve.

According to this method, gas solution can be supplied to the use point by opening the first, the second and the third valves and closing the fourth valve, while the first gas-liquid separator and the second gas-liquid separator can be cleaned by closing the second and the third valves and opening the first and the fourth valves.

The present invention can achieve a high concentration of gas solution and can suppress fluctuations in the delivery pressure of gas solution.

DETAILED DESCRIPTION OF THE PREFERRED EMBODIMENTS

Gas solution supply devices according to embodiments of the present invention are now described with reference to the drawings. The embodiments herein illustrate ozone water supply devices that are used for production of ozone water and the like.

First Embodiment

Figure 1:
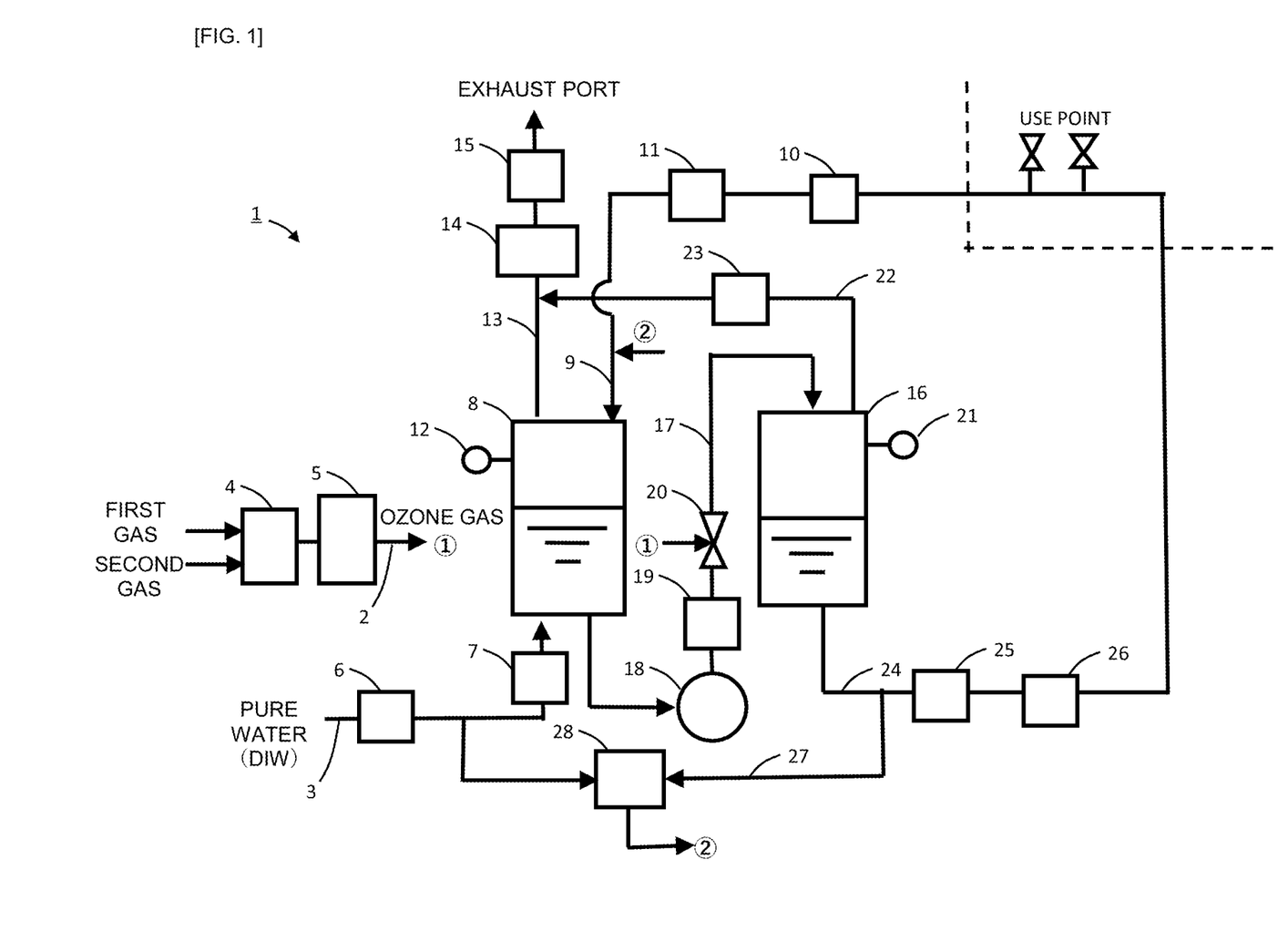
FIG. 1 illustrates a configuration of a gas solution supply device (ozone water supply device) in a first embodiment of the present invention.

Configuration of an ozone water supply device according to a first embodiment of the present invention is described with reference to a drawing. FIG. 1 illustrates a configuration of the ozone water supply device of this embodiment. As shown in FIG. 1, an ozone water supply device 1 includes a gas supply line 2 through which ozone gas as a material of ozone water is supplied and a liquid supply line 3 through which pure water (DIW) as a material of ozone water is supplied.

The gas supply line 2 is supplied with a first gas (e.g., oxygen gas) and a second gas (e.g., carbon dioxide gas, nitrogen gas, or mixed gas of carbon dioxide gas and nitrogen gas) as materials of ozone gas. The gas supply line 2 includes a gas flow rate adjuster 4 and an ozonizer 5. The gas flow rate adjuster 4 adjusts a flow rate of the first gas and that of the second gas. The ozonizer 5 generates ozone gas from the material gas (mixed gas of the first gas and the second gas) by electric discharge.

The liquid supply line 3 is supplied with pure water, with the flow rate of the pure water being adjusted by a flow regulating valve 6 and the flow rate of the pure water being measured by a flow sensor 7. The liquid supply line 3 is connected with a first gas-liquid separator 8. The first gas-liquid separator 8 is connected with a circulating supply line 9, which circulates and supplies unused ozone water at a use point.

The circulating supply line 9 includes a flow sensor 10 for measuring the flow rate of unused ozone water at the use point and a pressure regulating valve 11 for adjusting a pressure of the unused ozone water at the use point.

The first gas-liquid separator 8 stores unused ozone water and includes a level sensor 12 for measuring a level of the ozone water. The first gas-liquid separator 8 includes an exhaust line 13 for discharging undissolved ozone gas. The exhaust line 13 includes an ozone gas decomposer 14 for decomposing ozone gas and a pressure regulating valve 15 for adjusting the pressure of ozone gas being exhausted.

A second gas-liquid separator 16 in which ozone water to be supplied to the use point is stored is provided at a stage subsequent to (downstream of) the first gas-liquid separator 8, the first gas-liquid separator 8 and the second gas-liquid separator 16 being connected by an intermediate line 17.

The intermediate line 17 includes a pressure booster pump 18 that increases the pressure of ozone water being supplied from the first gas-liquid separator 8 to the second gas-liquid separator 16, a flow sensor 19 that measures the flow rate of ozone water being supplied to the second gas-liquid separator 16, and a gas dissolving nozzle 20 that dissolves the ozone gas supplied from the gas supply line 2 in the ozone water supplied from the first gas-liquid separator 8. The ozone water from the gas dissolving nozzle 20 may be introduced from an upper portion of the second gas-liquid separator 16. The ozone water from the gas dissolving nozzle 20 may also be introduced from a lower portion of the second gas-liquid separator 16. In that case, the gas dissolving nozzle 20 is preferably disposed in a lower portion of the second gas-liquid separator 16.

The pressure booster pump 18 can be a centrifugal pump, a bellows pump, or a diaphragm pump, for example. A portion of the pressure booster pump 18 that makes contact with ozone water and/or ozone gas is made of a material resistant to ozone water and ozone gas (e.g., fluorine resin).

The gas dissolving nozzle 20 can be an ejector or an aspirator, for example. An ejector and an aspirator can dissolve ozone gas in pure water by making use of Venturi effect. When an ejector or an aspirator is used, regular replacement would be unnecessary and diffusion rate would be also improved compared to an ozone dissolver using hollow fiber membrane. The gas dissolving nozzle 20 is preferably provided subsequent to the pressure booster pump 18. If the gas dissolving nozzle 20 is provided at a stage preceding the pressure booster pump 18, gas-liquid mixture would be supplied to the pressure booster pump 18, resulting in lower pumping and pressure boosting performances of the pressure booster pump 18 and lower flow rate and pressure of ozone water being supplied.

The second gas-liquid separator 16 has a level sensor 21 for measuring the level of ozone water. The second gas-liquid separator 16 also includes a discharge line 22 for discharging undissolved ozone gas. The discharge line 22 includes a pressure regulating valve 23 for adjusting the pressure of ozone gas being discharged from the second gas-liquid separator 16. In this embodiment, the discharge line 22 from the second gas-liquid separator 16 is connected with the exhaust line 13 from the first gas-liquid separator 8.

The second gas-liquid separator 16 includes an ozone water supply line 24 for supplying ozone water to the use point. The ozone water supply line 24 includes a flow sensor 25 for measuring the flow rate of the ozone water being supplied to the use point and a pressure sensor 26 for measuring the pressure of the ozone water being supplied to the use point.

The ozone water supply line 24 and the liquid supply line 3 each have a delivery line 27 branching from the ozone water supply line 24 and the liquid supply line 3, respectively, the delivery line 27 being connected with the circulating supply line 9. The delivery line 27 includes an ozone water concentration meter 28 for measuring a concentration of ozone water. The ozone water concentration meter 28 has a switching valve such that both a zero point of DIW can be measured and the concentration of ozone water can be checked.

With the ozone water supply device 1 of this embodiment, pressure control is performed by the pressure regulating valve 11 of the circulating supply line 9 so that a value of the pressure sensor 26 on the ozone water supply line 24 is constant. Pressure control is also performed with the pressure booster pump 18 on the intermediate line 17 so that the value of the flow sensor 25 on the ozone water supply line 24 is the same as the value of the flow sensor 19 on the intermediate line 17. Alternatively, flow rate control is performed with the flow regulating valve 6 on the liquid supply line 3 so that the difference between the value of the flow sensor 25 on the ozone water supply line 24 and the value of the flow sensor 10 on the circulating supply line 9 is the same as the value of the flow sensor 7 on the liquid supply line 3. Further, gas flow rate in the gas supply line 2 is adjusted with the adjuster 4 based on the value of the ozone water concentration meter 28 on the delivery line 27, and the gas concentration in the gas supply line 2 is adjusted with the ozonizer 5 (electric power discharged at the ozonizer 5 is adjusted), thus controlling the gas flow rate and the gas concentration (feed rate of ozone gas).

Since the ozone water supply device 1 of the first embodiment has the pressure booster pump 18 at a stage preceding the second gas-liquid separator 16 as described above, the pressure in the second gas-liquid separator 16 can be increased, enabling a high concentration of ozone water. Further, providing the second gas-liquid separator 16 at a stage subsequent to the pressure booster pump 18 results in damper effect, making it possible to suppress fluctuations in the delivery pressure of ozone water being supplied from the second gas-liquid separator 16 to the use point.

In addition, this embodiment can recycle unused ozone water at the use point and reduce usage of ozone gas and DIW as materials of ozone water. Since in this case the first gas-liquid separator 8, to which unused ozone water at the use point is supplied, is provided at a stage preceding the pressure booster pump 18, there is no need for a pump to increase the pressure of the unused ozone water.

Second Embodiment

Next, the ozone water supply device 1 according to a second embodiment of the present invention is discussed. Here, differences of the ozone water supply device 1 of the second embodiment from the first embodiment are focused. Unless otherwise noted, the configuration and operation of the second embodiment are similar to the first embodiment.

Figure 2:
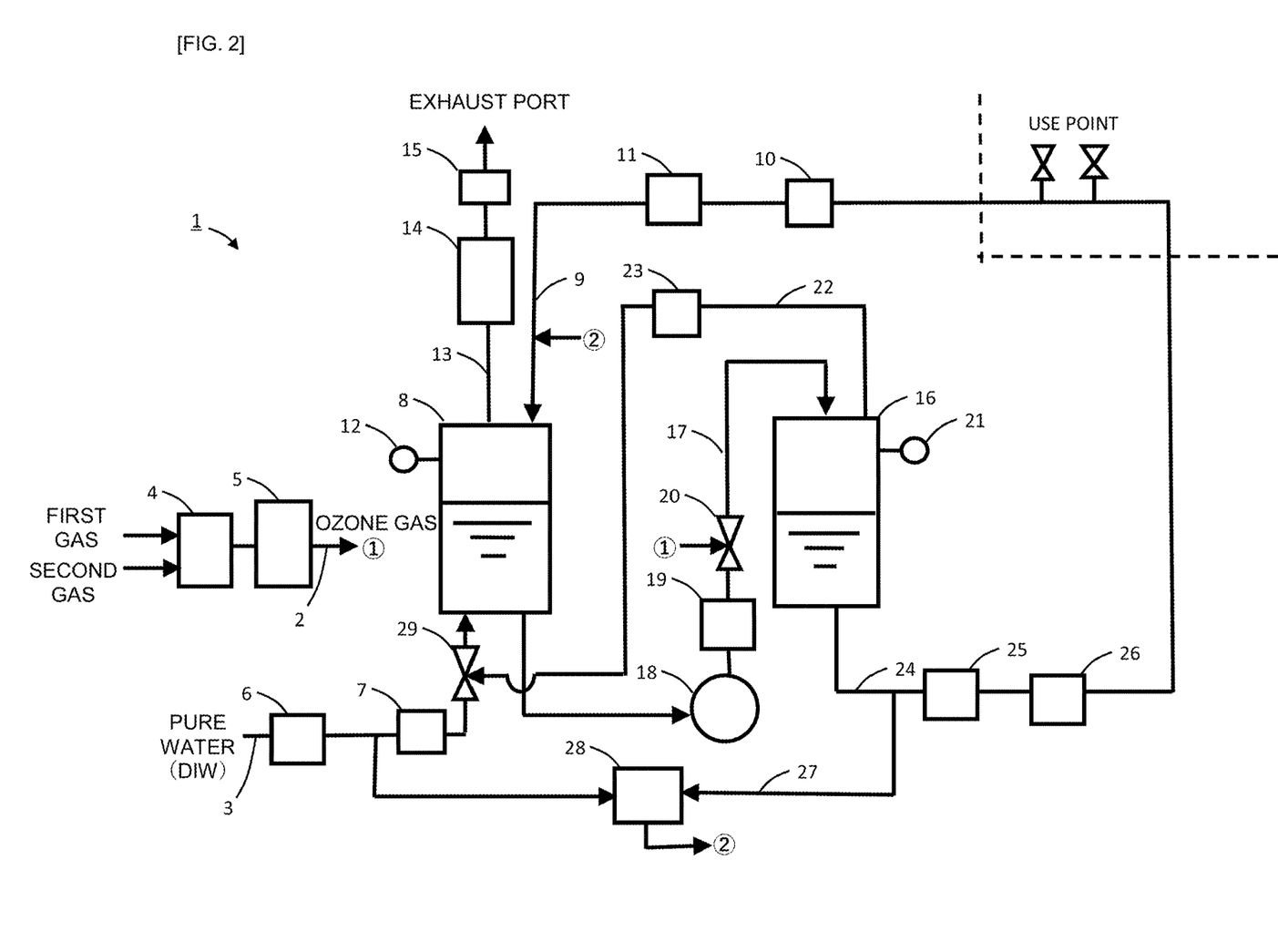
FIG. 2 illustrates a configuration of the gas solution supply device (ozone water supply device) in a second embodiment of the present invention.

FIG. 2 illustrates a configuration of the ozone water supply device 1 of this embodiment. As shown in FIG. 2, in the second embodiment, a second gas dissolving nozzle 29 is provided on the liquid supply line 3 and the discharge line 22 from the second gas-liquid separator 16 is connected to the second gas dissolving nozzle 29. The second gas dissolving nozzle 29 dissolves undissolved excess ozone gas discharged from the second gas-liquid separator 16 in pure water being supplied to the liquid supply line 3. The first gas-liquid separator 8 is supplied with ozone water from the liquid supply line 3. The ozone water from the gas dissolving nozzle 29 may be introduced from an upper portion of the first gas-liquid separator 8. The ozone water from the gas dissolving nozzle 29 may also be introduced from a lower portion of the first gas-liquid separator 8. In that case, the gas dissolving nozzle 29 is preferably disposed in a lower portion of the first gas-liquid separator 8.

In the ozone water supply device 1 of this embodiment, pressure control is also performed with the pressure regulating valve 11 on the circulating supply line 9 so that the value of the pressure sensor 26 on the ozone water supply line 24 is constant as with the first embodiment. Flow rate control is also performed with the pressure booster pump 18 on the intermediate line 17 so that the value of the flow sensor 25 on the ozone water supply line 24 is the same as the value of the flow sensor 19 on the intermediate line 17. Alternatively, flow rate control is performed with the flow regulating valve 6 on the liquid supply line 3 so that the difference between the value of the flow sensor 25 on the ozone water supply line 24 and the value of the flow sensor 10 on the circulating supply line 9 is the same as the value of the flow sensor 7 on the liquid supply line 3. Further, gas flow rate in the gas supply line 2 is adjusted with the adjuster 4 based on the value of the ozone water concentration meter 28 on the delivery line 27, and the gas concentration in the gas supply line 2 is adjusted with the ozonizer 5 (electric power discharged at the ozonizer 5 is adjusted), thus controlling the gas flow rate and the gas concentration (the feed rate of ozone gas).

The ozone water supply device 1 of the second embodiment as described above also provides similar effects to the first embodiment.

Besides, this embodiment can recycle undissolved excess ozone gas discharged from the second gas-liquid separator 16, further reducing the usage of ozone gas as a material of ozone water. Further, this embodiment enables a further higher concentration of ozone water than in the first embodiment.

Third Embodiment

Next, the ozone water supply device 1 according to a third embodiment of the present invention is described. Here, differences of the ozone water supply device 1 of the third embodiment from the second embodiment are focused. Unless otherwise noted, the configuration and operation of the third embodiment are similar to the second embodiment.

Figure 3:
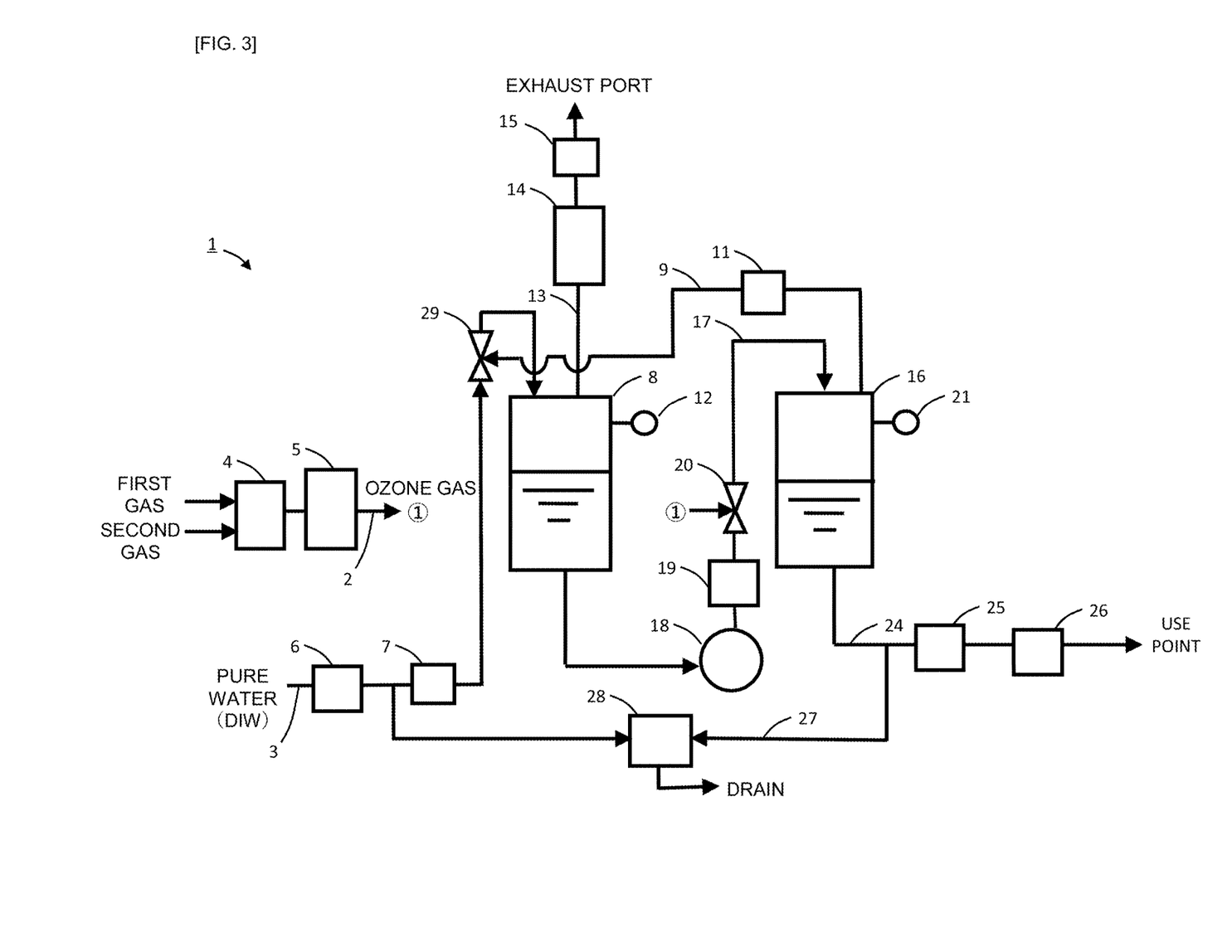
FIG. 3 illustrates a configuration of the gas solution supply device (ozone water supply device) in a third embodiment of the present invention.

FIG. 3 illustrates a configuration of the ozone water supply device 1 of this embodiment. As shown in FIG. 3, this embodiment does not include the circulating supply line 9 to circulate unused ozone water at the use point and supply it to the first gas-liquid separator 8. Thus, the pressure in the first gas-liquid separator 8 can be made high compared with the first and second embodiments, allowing a higher concentration of ozone water.

With the ozone water supply device 1 of this embodiment, pressure control is performed by the pressure regulating valve 11 of the circulating supply line 9 so that the value of the flow sensor 25 or the pressure sensor 26 on the ozone water supply line 24 is constant. Further, flow rate control is performed with the pressure booster pump 18 on the intermediate line 17 so that the value of flow sensor 25 on the ozone water supply line 24 is the same as the value of the flow sensor 19 on the intermediate line 17, and flow rate control is further performed with the flow regulating valve 6 on the liquid supply line 3 so that the value of the flow sensor 7 on the liquid supply line 3 is the same as well. Moreover, gas flow rate in the gas supply line 2 is adjusted with the adjuster 4 based on the value of the ozone water concentration meter 28 on the delivery line 27, and the gas concentration in the gas supply line 2 is adjusted with the ozonizer 5 (electric power discharged at the ozonizer 5 is adjusted), thus controlling the gas flow rate and the gas concentration (the feed rate of ozone gas).

The ozone water supply device 1 of the third embodiment as described above also provides similar effects to the second embodiment.

Although this embodiment does not allow recycling of unused ozone water at the use point since the circulating supply line 9 is not present, further higher concentration is possible than in the second embodiment.

Fourth Embodiment

Next, the ozone water supply device 1 according to a fourth embodiment of the present invention is discussed. Here, differences of the ozone water supply device 1 of the fourth embodiment from the first embodiment are focused. Unless otherwise noted, the configuration and operation of the fourth embodiment are similar to the first embodiment.

Figure 4:
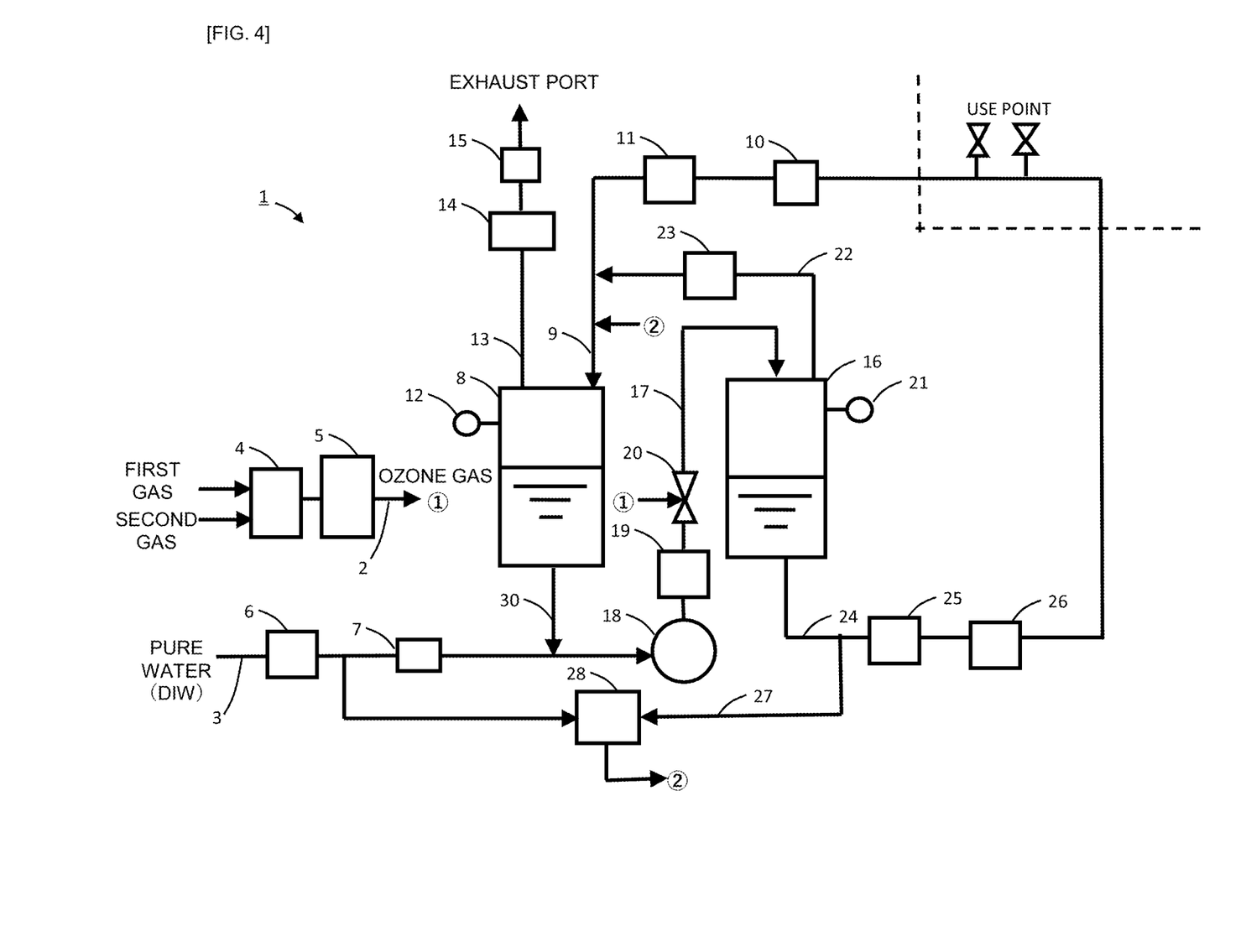
FIG. 4 illustrates a configuration of the gas solution supply device (ozone water supply device) in a fourth embodiment of the present invention.

FIG. 4 illustrates a configuration of the ozone water supply device 1 of this embodiment. As shown in FIG. 4, in this embodiment, the liquid supply line 3 is not connected with the first gas-liquid separator 8 but with the pressure booster pump 18. Further, the liquid supply line 3 meets an ozone water supply line 30 on which ozone water from the first gas-liquid separator 8 is supplied. Further, the discharge line 22 of the second gas-liquid separator 16 is not connected with the exhaust line 13 but with the circulating supply line 9.

The ozone water supply device 1 of the fourth embodiment as described above also provides similar effects to the first embodiment.

(Internal Cleaning of Gas-Liquid Separators)

The ozone water supply device 1 can have an internal cleaning function for the gas-liquid separators 8, 16. In the following, examples (variations) of the ozone water supply device 1 having a cleaning function for the gas-liquid separators is described.

(Variation 1)

Figure 5:
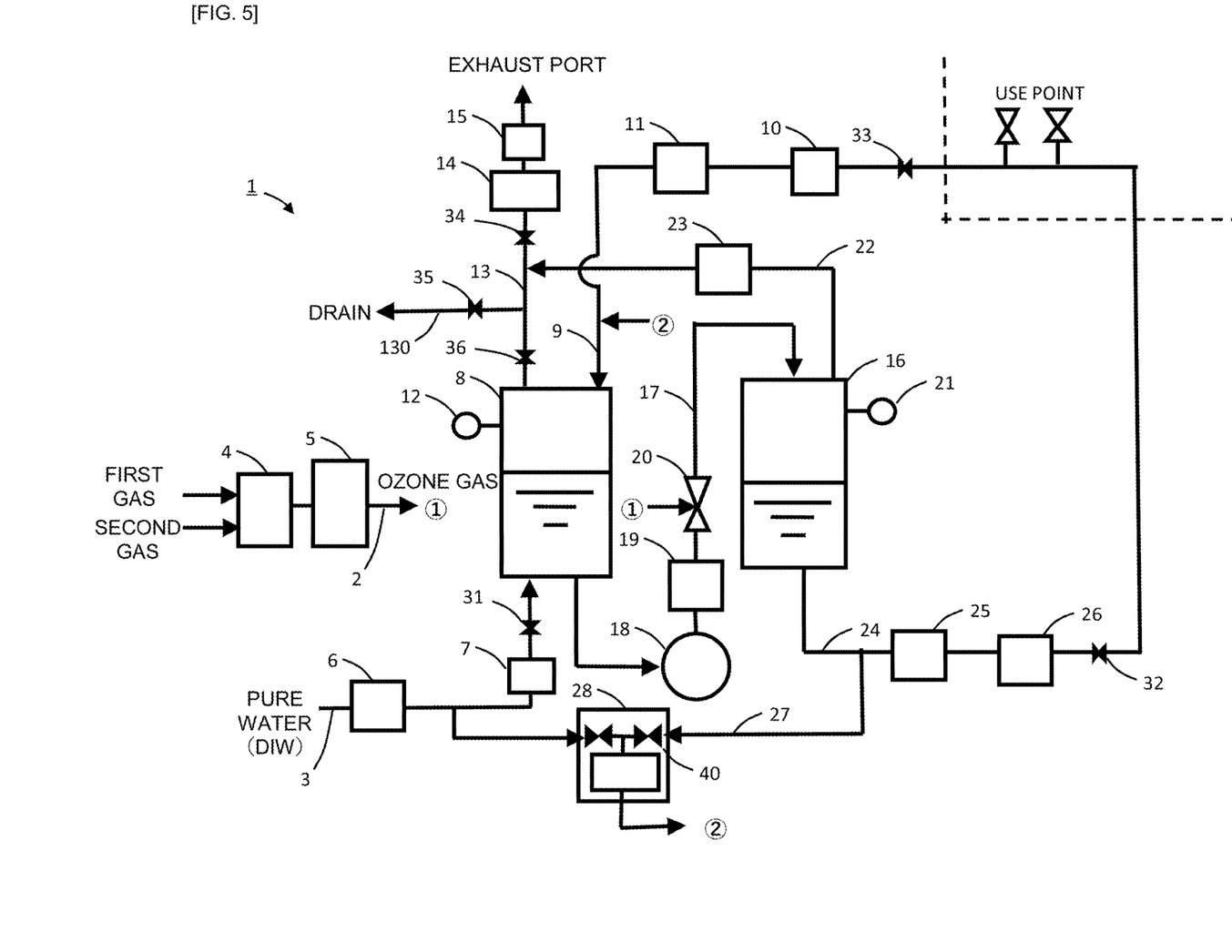
FIG. 5 shows a configuration of a variation of the gas solution supply device (ozone water supply device) of the first embodiment.

FIG. 5 shows a configuration of a variation (Variation 1) of the ozone water supply device 1 of the first embodiment. As shown in FIG. 5, in Variation 1, a valve 31 is provided on the liquid supply line 3, on which pure water is supplied, and a valve 32 is provided on the ozone water supply line 24, which supplies ozone water to the use point. A valve 33 is provided on the circulating supply line 9, which returns unused ozone water at the use point to the ozone water supply device 1. Further, a valve 34 is provided on the exhaust line 13 from the first gas-liquid separator 8 to an exhaust port, and a valve 35 is provided on a drain line 130 branching from the exhaust line 13. The exhaust line 13 further includes a valve 36 having an opening adjusting function. These valves 31 to 36 can be controlled for opening and closing by a control unit (not shown) provided in the ozone water supply device 1.

In Variation 1, when ozone water is to be supplied to the use point, open and close control is performed such that the valve 32, the valve 33, the valve 34 and the valve 36 are opened and the valve 35 is closed. The valve 31 is controlled for opening and closing according to the level in the first gas-liquid separator 8 as detected by the level sensor 12. Specifically, open and close control is performed such that the valve 31 is closed when the level in the first gas-liquid separator 8 is high and the valve 31 is opened when the level in the first gas-liquid separator 8 is low.

In contrast, when supply of ozone water to the use point is stopped and the gas-liquid separators 8, 16 are to be cleaned, open and close control is performed such that the valve 31 and the valve 35 are opened, the degree of opening of the valve 36 is reduced, and the valve 32, the valve 33 and the valve 34 are closed. In doing so, the level sensors 12, 21 are placed in a state where their high-level warning function is disabled. Further, supply of ozone gas from the gas supply line 2 is also stopped.

Once pure water is supplied from the liquid supply line 3, the valve 31 is opened and the degree of opening of the valve 36 is reduced, thus causing gas in the first gas-liquid separator 8 to gradually escape and the first gas-liquid separator 8 to be filled with pure water. Since the valve 32 is closed and the valve 40 within the ozone water concentration meter 28 is also closed, the level in the second gas-liquid separator 16 gradually rises, until the second gas-liquid separator 16 is filled with pure water. In this manner, insides of the first gas-liquid separator 8 and the second gas-liquid separator 16 can be cleaned with pure water.

With the valve 32 being closed, pure water from the second gas-liquid separator 16 is sent from the discharge line 22 to the exhaust line 13. Then, the pure water is discharged to a drain from the drain line 130 branching from the exhaust line 13.

In this case, as the valve 34 is closed and the valve 35 is opened, pure water from the first gas-liquid separator 8 is discharged to the drain from the drain line 130 branching from the exhaust line 13. In a case where an ozone decomposer (not shown) is provided on the drain line 130, the insides of the gas-liquid separators 8, 16 can be cleaned with ozone water instead of pure water (ozone water has higher cleaning effect than pure water) by not stopping the supply of ozone gas.

According to Variation 1, by performing open and close control of the valves 31 to 36 as described above, ozone water can be supplied to the use point and also the insides of the first gas-liquid separator 8 and the second gas-liquid separator 16 can be cleaned with pure water.

(Variation 2)

Next, a variation (Variation 2) of the ozone water supply device 1 according to the second embodiment is described. Here, differences of Variation 2 from Variation 1 are focused. Unless otherwise noted, the configuration and operation of Variation 2 are similar to Variation 1.

Figure 6:
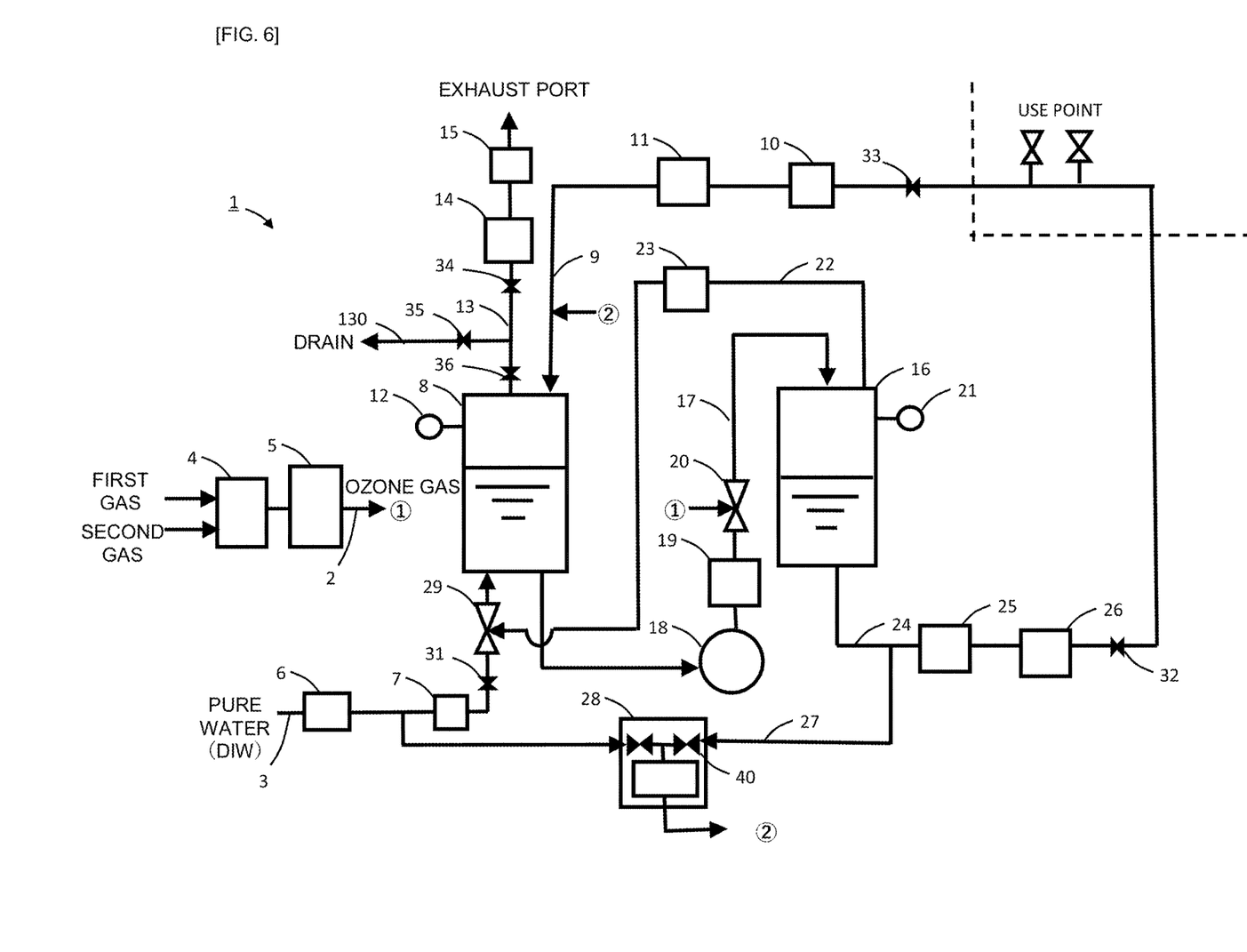
FIG. 6 shows a configuration of a variation of the gas solution supply device (ozone water supply device) of the second embodiment.

FIG. 6 shows a configuration of the ozone water supply device 1 in Variation 2. Pure water from the second gas-liquid separator 16 is sent from the discharge line 22 to the first gas-liquid separator 8 via the nozzle 29. The valve 36 is opened and pure water from the first gas-liquid separator 8 is discharged to the drain from the drain line 130 branching from the exhaust line 13.

In Variation 2 as described above, ozone water can also be supplied to the use point and the insides of the first gas-liquid separator 8 and the second gas-liquid separator 16 can be cleaned with pure water by performing open and close control of the valves 31 to 36 as with Variation 1.

(Variation 3)

Next, a variation (Variation 3) of the ozone water supply device 1 according to the third embodiment is described. Here, differences of Variation 3 from Variation 1 are focused. Unless otherwise noted, the configuration and operation of Variation 3 are similar to Variation 1.

Figure 7:
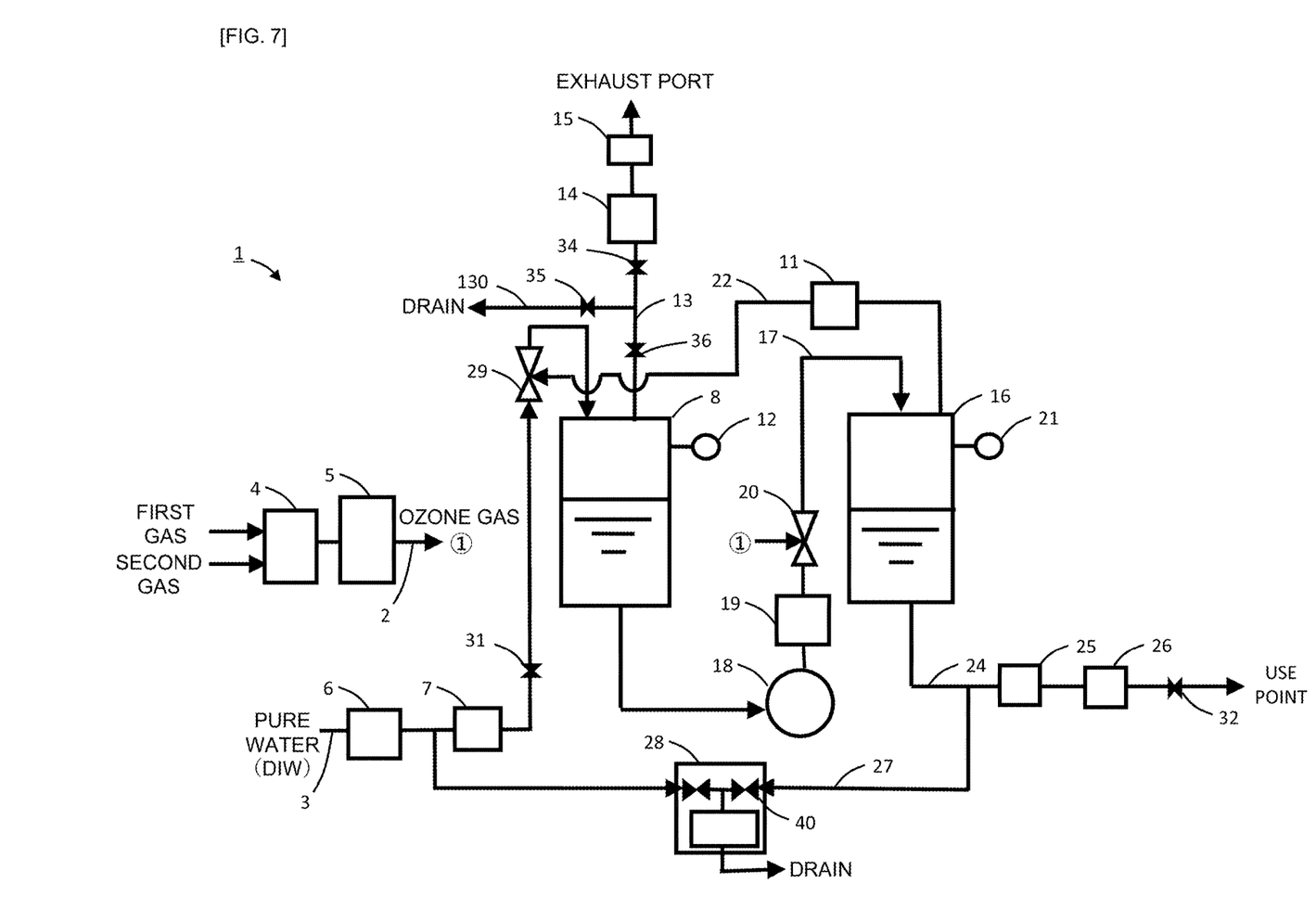
FIG. 7 shows a configuration of a variation of the gas solution supply device (ozone water supply device) of the third embodiment.

FIG. 7 shows a configuration of the ozone water supply device 1 in Variation 3. Since the ozone water supply device 1 of Variation 3 does not include the circulating supply line 9, it does not include the valve 33 provided on the circulating supply line 9 either. Pure water from the second gas-liquid separator 16 is sent from the discharge line 22 to the first gas-liquid separator 8 via the nozzle 29. The valve 36 is opened and pure water from the first gas-liquid separator 8 is discharged to the drain from the drain line 130 branching from the exhaust line 13.

In Variation 3 as described above, ozone water can also be supplied to the use point and the insides of the first gas-liquid separator 8 and the second gas-liquid separator 16 can be cleaned with pure water by performing open and close control of the valves 31, 32, 34, 35, 36 as with Variation 1.

(Variation 4)

Next, a variation (Variation 4) of the ozone water supply device 1 according to the fourth embodiment is described. Here, differences of Variation 4 from Variation 1 are focused. Unless otherwise noted, the configuration and operation of Variation 4 are similar to Variation 1.

Figure 8:
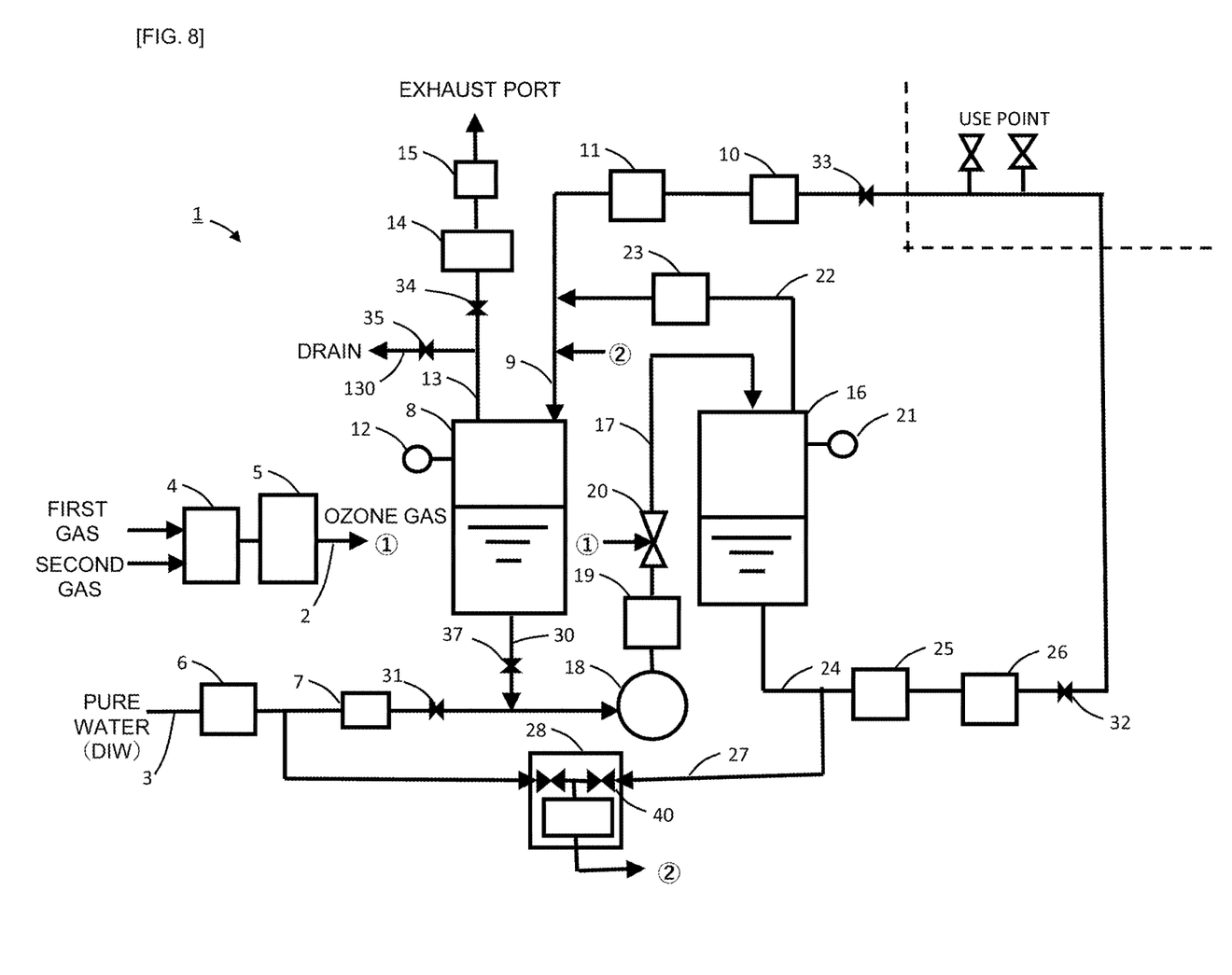
FIG. 8 shows a configuration of a variation of the gas solution supply device (ozone water supply device) of the fourth embodiment.

FIG. 8 shows a configuration of the ozone water supply device 1 in Variation 4. As shown in FIG. 8, in Variation 4, the valve 36 with an opening adjusting function is not provided on the exhaust line 13. Rather, in Variation 4, a valve 37 is provided on the ozone water supply line 30 from the first gas-liquid separator 8.

In Variation 4, when ozone water is to be supplied to the use point, open and close control is performed such that the valve 32, valve 33, the valve 34 and the valve 37 are opened and the valve 35 is closed. The valve 31 is controlled for opening and closing according to the level in the first gas-liquid separator 8 as detected by the level sensor 12. Specifically, open and close control is performed such that the valve 31 is closed when the level in the first gas-liquid separator 8 is high and the valve 31 is opened when the level in the first gas-liquid separator 8 is low.

In contrast, when supply of ozone water to the use point is stopped and the gas-liquid separators 8, 16 are to be cleaned, open and close control is performed such that the valve 31 and the valve 35 are opened and the valve 32, the valve 33, the valve 34 and the valve 37 are closed. In doing so, the level sensors 12, 21 are placed in a state where their high-level warning function is disabled. Further, supply of ozone gas from the gas supply line 2 is also stopped.

Once pure water is supplied from the liquid supply line 3, the level in the second gas-liquid separator 16 gradually rises since the valve 32 and the valve 37 are closed, until the second gas-liquid separator 16 is filled with pure water. In this manner, the inside of the second gas-liquid separator 16 can be cleaned with pure water.

With the valve 32 and the valve 37 being closed, pure water from the second gas-liquid separator 16 is sent from the discharge line 22 to the circulating supply line 9. Here, as the valve 33 is closed, the pure water sent to the circulating supply line 9 is supplied to the first gas-liquid separator 8. Then, with the valve 37 being closed, the level in the first gas-liquid separator 8 also gradually rises, until the first gas-liquid separator 8 is filled with pure water. In this manner, the inside of the first gas-liquid separator 8 can be cleaned with pure water.

Since in this case the valve 34 is closed and the valve 35 is opened, pure water from the first gas-liquid separator 8 is discharged to the drain from the drain line 130 branching from the exhaust line 13.

In Variation 4, ozone water can also be supplied to the use point and the insides of the first gas-liquid separator 8 and the second gas-liquid separator 16 can be cleaned with pure water by performing open and close control of the valves 31 to 35 and 37 as described above.

OTHER EXAMPLES

Figure 9:
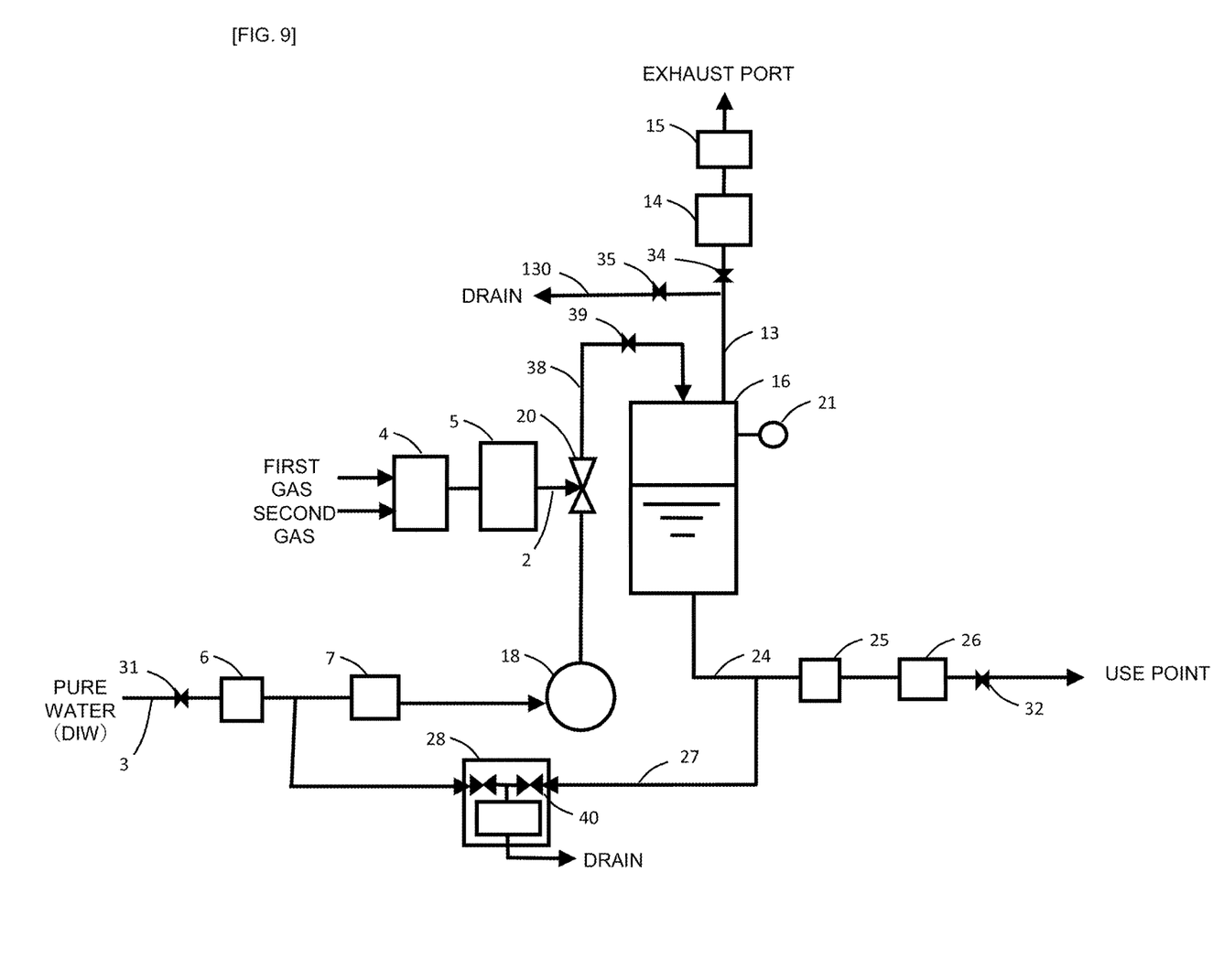
FIG. 9 shows another example of the gas solution supply device (ozone water supply device).

FIG. 9 shows another example of the ozone water supply device 1. In the example of FIG. 9, the first gas-liquid separator 8 is not provided, while a valve 39 is provided on a supply line 38 which supplies ozone water generated via the gas dissolving nozzle 20 to the second gas-liquid separator 16. Further, the exhaust line 13 is provided at the second gas-liquid separator 16.

In the example of FIG. 9, when ozone water is to be supplied to the use point, open and close control is performed so that the valve 32, the valve 34 and the valve 39 are opened and the valve 35 is closed. The valve 31 is controlled for opening and closing according to the level in the second gas-liquid separator 16 as detected by the level sensor 21. Specifically, open and close control is performed such that the valve 31 is closed when the level in the second gas-liquid separator 16 is high and the valve 31 is opened when the level in the second gas-liquid separator 16 is low.

In contrast, when supply of ozone water to the use point is stopped and the second gas-liquid separator 16 is to be cleaned, open and close control is performed such that the valve 31, the valve 35, and the valve 39 are opened and the valve 32 and the valve 34 are closed. In doing so, the level sensor 21 is placed in a state where its high-level warning function is disabled. Further, supply of ozone gas from the gas supply line 2 is also stopped.

Once pure water is supplied from the liquid supply line 3, the level in the second gas-liquid separator 16 gradually rises since the valve 32 is closed, until the second gas-liquid separator 16 is filled with pure water. In this manner, the inside of the second gas-liquid separator 16 can be cleaned with pure water.

Since in this case the valve 34 is closed and the valve 35 is opened, pure water from the second gas-liquid separator 16 is discharged to the drain from the drain line 130 branching from the exhaust line 13.

With the example of FIG. 9, ozone water can also be supplied to the use point and the inside of the second gas-liquid separator 16 can be cleaned with pure water by performing open and close control of the valves 31, 32, 34, 35, 39 as described above.

While the embodiments of the present invention have been described by way of example, the scope of the present invention is not limited to them and may be modified or altered according to an objective within the scope as defined by the claims.

As shown above, the gas solution supply devices according to the present invention has the effects of enabling a high concentration of gas solution and suppressing fluctuations in the delivery pressure of gas solution, and can be advantageously used for production of ozone water and the like.

REFERENCE SIGNS LIST 1 ozone water supply device
2 gas supply line
3 liquid supply line
4 gas flow rate adjuster
5 ozonizer
6 flow regulating valve
7 flow sensor
8 the first gas-liquid separator
9 circulating supply line
10 flow sensor
11 pressure regulating valve
12 level sensor
13 exhaust line
14 ozone gas decomposer
15 pressure regulating valve
16 the second gas-liquid separator
17 intermediate line
18 pressure booster pump
19 flow sensor
20 gas dissolving nozzle
21 level sensor
22 discharge line
23 pressure regulating valve
24 ozone water supply line
25 flow sensor
26 pressure sensor
27 delivery line
28 ozone water concentration meter
29 the second gas dissolving nozzle
30 ozone water supply line
31-37 valves
38 supply line
39 valve
40 valve

What is claimed is:

1. A gas solution supply device comprising:
a first gas-liquid separator in which gas solution is stored;
a second gas-liquid separator which is provided at a stage subsequent to the first gas-liquid separator and in which gas solution to be supplied to a use point is stored;
an intermediate line provided between the first gas-liquid separator and the second gas-liquid separator;
a pressure booster pump that is provided on the intermediate line and increases a pressure of gas solution being supplied from the first gas-liquid separator to the second gas-liquid separator;
a gas supply line that supplies gas as a material of the gas solution; and
a first gas dissolving unit that is provided on the intermediate line and dissolves the gas supplied from the gas supply line in the gas solution supplied from the first gas-liquid separator,
wherein the first gas-liquid separator comprises a liquid supply line through which liquid as a material of the gas solution is supplied, the liquid supply line comprising a second gas dissolving unit that dissolves undissolved excess gas discharged from the second gas-liquid separator in the liquid as a material of the gas solution.

2. The gas solution supply device according to claim 1, wherein the first gas-liquid separator comprises a circulating supply line for circulating and supplying unused gas solution at the use point.

3. The gas solution supply device according to claim 1, comprising:
a first valve provided on the liquid supply line;
a second valve provided on a gas solution supply line that supplies the gas solution to the use point;
a third valve provided on an exhaust line from the first gas-liquid separator to an exhaust port;
a fourth valve provided on a drain line branching from the exhaust line; and
a control unit that performs open and close control of the first valve, the second valve, the third valve, and the fourth valve,
wherein the control unit is configured to:
when the gas solution is to be supplied to the use point, perform control to open the first valve, the second valve and the third valve and close the fourth valve, and
when the first gas-liquid separator and the second gas-liquid separator are to be cleaned, perform control to close the second valve and the third valve and open the first valve and the fourth valve.

4. A method for execution using the gas solution supply device according to claim 1,
the method comprising the steps of:
supplying gas as a material of the gas solution to the intermediate line; and
dissolving the supplied gas in the gas solution supplied from the first gas-liquid separator.

5. The method according to claim 4, wherein the gas solution supply device comprises:
a first valve provided on the liquid supply line;
a second valve provided on a gas solution supply line that supplies the gas solution to the use point;
a third valve provided on an exhaust line from the first gas-liquid separator to an exhaust port; and
a fourth valve provided on a drain line branching from the exhaust line,
the method comprising:
when the gas solution is to be supplied to the use point, opening the first valve, the second valve and the third valve and closing the fourth valve, and
when the first gas-liquid separator and the second gas-liquid separator are to be cleaned, closing the second valve and the third valve and opening the first valve and the fourth valve.

* * * * *